(12) United States Patent
Li

(10) Patent No.: US 10,978,564 B2
(45) Date of Patent: Apr. 13, 2021

(54) SEMICONDUCTOR DEVICE AND METHOD OF MANUFACTURING THE SAME

(71) Applicant: Gpower Semiconductor, Inc., Suzhou (CN)

(72) Inventor: Yuan Li, Suzhou (CN)

(73) Assignee: GPOWER SEMICONDUCTOR, INC., Suzhou (CN)

( * ) Notice: Subject to any disclaimer, the term of this patent is extended or adjusted under 35 U.S.C. 154(b) by 46 days.

(21) Appl. No.: 16/199,055

(22) Filed: Nov. 23, 2018

(65) Prior Publication Data

US 2019/0123151 A1    Apr. 25, 2019

Related U.S. Application Data

(63) Continuation of application No. PCT/CN2018/077910, filed on Mar. 2, 2018.

(30) Foreign Application Priority Data

Mar. 29, 2017    (CN) .......................... 201710196548.1

(51) Int. Cl.
*H01L 29/40* (2006.01)
*H01L 29/66* (2006.01)
*H01L 29/06* (2006.01)
*H01L 29/78* (2006.01)
*H01L 29/778* (2006.01)
*H01L 29/20* (2006.01)

(52) U.S. Cl.
CPC ........ *H01L 29/402* (2013.01); *H01L 29/0649* (2013.01); *H01L 29/408* (2013.01); *H01L 29/66462* (2013.01); *H01L 29/66477* (2013.01); *H01L 29/66568* (2013.01); *H01L 29/7786* (2013.01); *H01L 29/78* (2013.01); *H01L 29/2003* (2013.01)

(58) Field of Classification Search
CPC ............ H01L 29/402; H01L 29/66462; H01L 29/408; H01L 29/66568; H01L 29/7786; H01L 29/66477; H01L 29/0649; H01L 29/78; H01L 29/2003
See application file for complete search history.

(56) References Cited

U.S. PATENT DOCUMENTS

| | | | |
|---|---|---|---|
| 2008/0157091 A1* | 7/2008 | Shin | H01L 29/7834 257/66 |
| 2009/0146185 A1* | 6/2009 | Suh | H01L 29/517 257/194 |
| 2017/0077284 A1* | 3/2017 | Ono | H01L 29/66462 |
| 2017/0309712 A1* | 10/2017 | Yamada | H01L 21/02576 |

* cited by examiner

*Primary Examiner* — Mohammed R Alam
(74) *Attorney, Agent, or Firm* — Flener IP & Business Law; Zareefa B. Flener

(57) ABSTRACT

The present disclosure relates to a semiconductor device and a method of manufacturing the same. The semiconductor device includes a semiconductor layer; a source electrode, a drain electrode and a gate electrode located between the source electrode and the drain electrode disposed on a side of the semiconductor layer; at least two dielectrics located between the gate electrode and the drain electrode, wherein a dielectric coefficient of a dielectric adjacent to the gate electrode is greater than that of a dielectric away from the gate electrode and adjacent to the drain electrode.

17 Claims, 9 Drawing Sheets

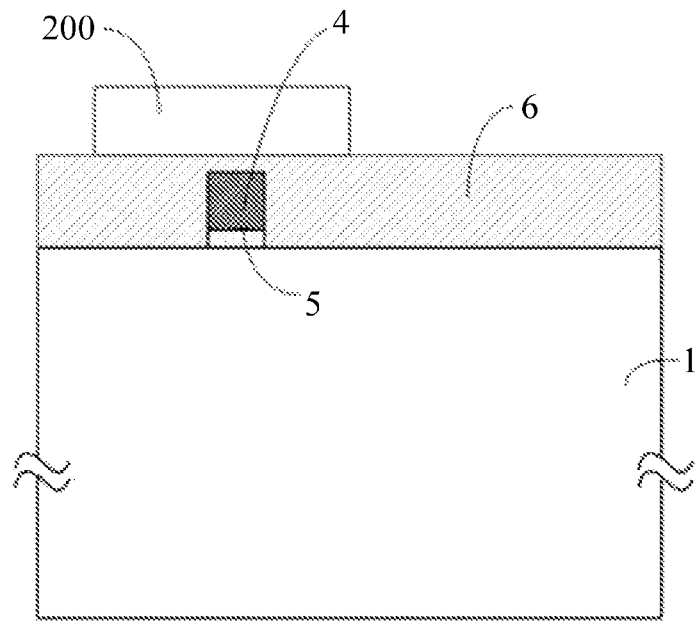
Fig. 11-a
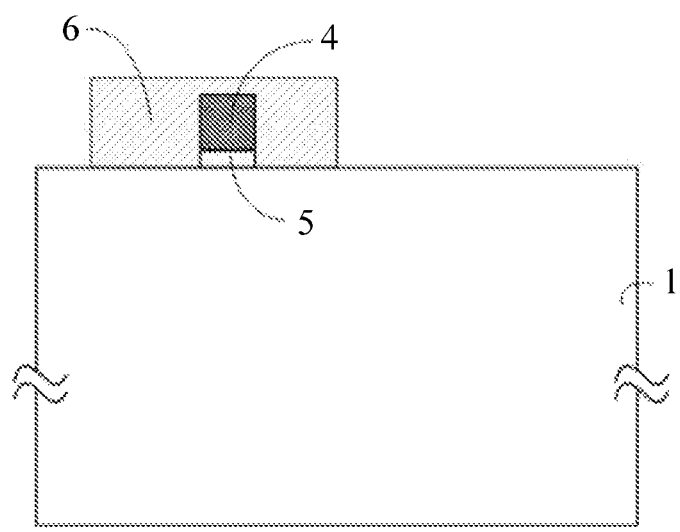
Fig.11-b

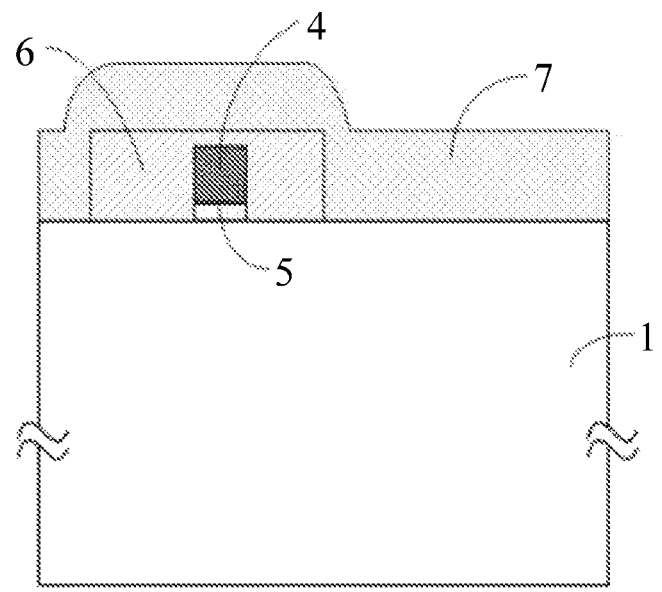
Fig.11-c
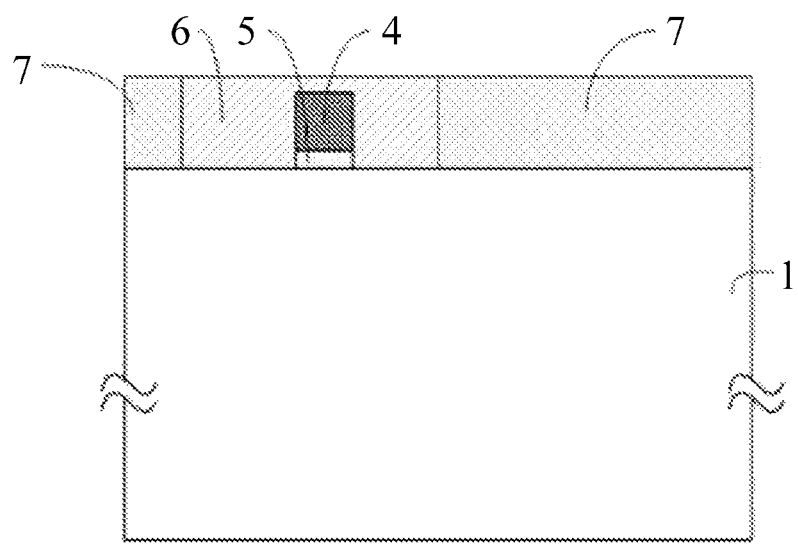
Fig.11-d

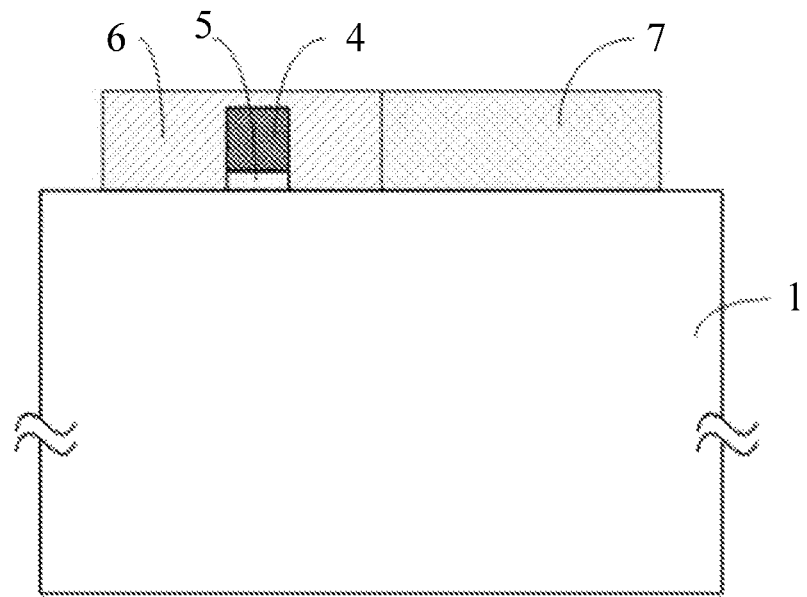
Fig.11-e
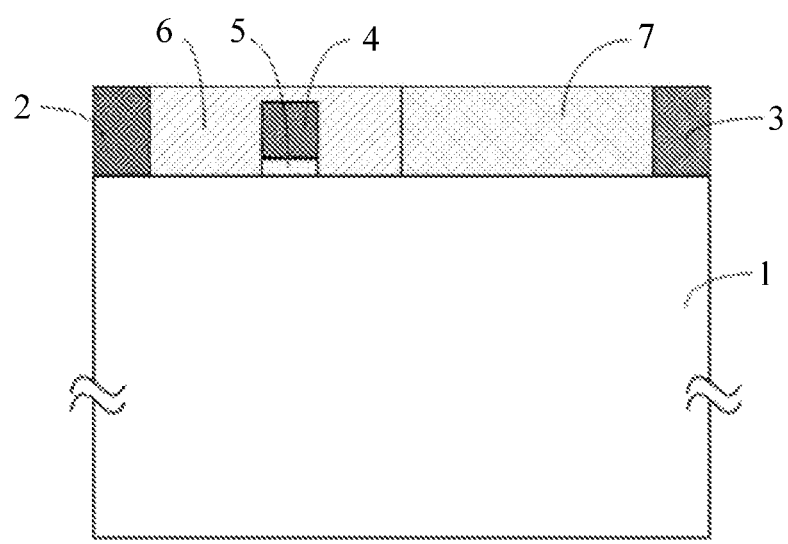
Fig.11-f

SEMICONDUCTOR DEVICE AND METHOD OF MANUFACTURING THE SAME

CROSS-REFERENCE TO RELATED APPLICATIONS

This application is a continuation of international application No. PCT/CN2018/077910 filed on Mar. 2, 2018, which claims the benefit and priority of Chinese patent application No. 201710196548.1, entitled "semiconductor device and method of manufacturing the same" and filed on Mar. 29, 2017. Both applications are incorporated herein in their entirety by reference.

TECHNICAL FIELD

The present disclosure relates to the field of semiconductor and semiconductor manufacturing technologies, and more particularly, to a semiconductor device and a method of manufacturing the same.

BACKGROUND

In a common field effect semiconductor device working under a high drain-source voltage, a high electric field peak is formed at a side of a gate electrode which is adjacent to a drain electrode. Such a high electric field in a local region may result in high leakage and even material breakdown, thereby reducing a breakdown voltage of the device. Meanwhile, as time passes, semiconductor material of the device may be degraded or denatured due to the high electric field, which reduces reliability and service life of the device. Therefore, in structure design and process development for a semiconductor device, it is required to reduce strength of an electric field near an edge of the gate electrode which is adjacent to the drain electrode to improve the breakdown voltage and thus the reliability of the device.

At present, in order to reduce the strength of the electric field near the gate electrode, a field plate is usually disposed at the side of the gate electrode which is adjacent to the drain electrode and is connected to a source electrode or the gate electrode. In this way, an additional potential is generated in the gate-drain region, and thus an electric field peak near the edge of the gate electrode which is adjacent to the drain electrode can be effectively suppressed, thereby improving the breakdown voltage and the reliability of the device. However, since a bottom of the field plate is substantially parallel to a surface of the semiconductor material, although the electric field spike near the edge of the gate electrode can be reduced, a new low electric field spike will be formed near an end of the field plate. The new electric field spike will increase as a length of the field plate increases, which will easily lead to breakdown or failure in a region near the end of the field plate. Accordingly, a problem of the breakdown of the device has not been solved fundamentally, and a risk of the breakdown is just transferred to another region. In addition, if a field plate is too long, a relatively high parasitic capacitance will be generated, which will affect high frequency characteristics of the device.

SUMMARY

In view of the above, an object of the present disclosure is to provide a semiconductor device and a method of manufacturing the same, so as to solve above problems.

To achieve the above object, an aspect of the present disclosure provides a semiconductor device, including: a semiconductor layer; a source electrode, a drain electrode and a gate electrode located between the source electrode and the drain electrode disposed on a side of the semiconductor layer; and at least two dielectrics located between the gate electrode and the drain electrode, wherein a dielectric coefficient of a dielectric adjacent to the gate electrode is greater than that of a dielectric away from the gate electrode and adjacent to the drain electrode.

In an embodiment of the present disclosure, the semiconductor device further includes a field plate disposed on a side of the dielectric away from the away from the semiconductor layer, wherein an end of the field plate adjacent to the drain electrode is disposed above a dielectric adjacent to the drain electrode.

In an embodiment of the present disclosure, the dielectric coefficients of the at least two dielectrics sequentially decreases in a direction from the gate electrode to the drain electrode.

In an embodiment of the present disclosure, an end of the field plate located between the gate electrode and the drain electrode is disposed above a dielectric having a small dielectric coefficient.

In an embodiment of the present disclosure, the at least two dielectrics include a first dielectric and a second dielectric, wherein the first dielectric is adjacent to the gate electrode, the second dielectric is located between the first dielectric and the drain electrode, an end of the field plate adjacent to the drain electrode is disposed on the second dielectric, the first dielectric is connected to the second dielectric, and a dielectric coefficient of the first dielectric is greater than that of the second dielectric.

In an embodiment of the present disclosure, a contact surface between the first dielectric and the second dielectric is a plane, and an angle between the plane and a surface of the semiconductor layer is greater than 0° and less than 180°.

In an embodiment of the present disclosure, a contact surface between the first dielectric and the second dielectric is a curved surface.

In an embodiment of the present disclosure, the first dielectric has a first step portion at a contact surface with the second dielectric, and the second dielectric has a second step portion matching with the first step portion at a contact surface with the first dielectric.

In an embodiment of the present disclosure, the at least two dielectrics include a first dielectric, a second dielectric and a third dielectric, wherein the first dielectric is adjacent to the gate electrode, the third dielectric is adjacent to the drain electrode, the second dielectric is located between the first dielectric and the third dielectric, a dielectric coefficient of the first dielectric is greater than that of the second dielectric, and the dielectric coefficient of the second dielectric is greater than that of the third dielectric.

In an embodiment of the present disclosure, the field plate is connected to the source electrode and extends upward over the gate electrode to the drain electrode, and at least extends onto the second dielectric.

In an embodiment of the present disclosure, the field plate is connected to the gate electrode and extends from the gate electrode to the drain electrode, and at least extends onto the second dielectric.

In an embodiment of the present disclosure, the semiconductor layer includes a semiconductor substrate and an epitaxial layer grown on the semiconductor substrate.

In an embodiment of the present disclosure, the semiconductor layer includes a substrate, a buffer layer disposed on a side of the substrate, a channel layer disposed on a side of the buffer layer away from the substrate, and a barrier layer disposed on a side of the channel layer away from the buffer layer.

Another aspect of the present disclosure provides a method of manufacturing a semiconductor device, including: preparing a semiconductor layer; forming a gate electrode on the semiconductor layer; forming a source electrode and a drain electrode respectively located on two sides of the gate electrode on the semiconductor layer; and forming at least two dielectrics located between the gate electrode and the drain electrode on the semiconductor layer, wherein, in the at least two dielectrics, a dielectric coefficient of a dielectric adjacent to the gate electrode is greater than that of a dielectric away from the gate electrode and adjacent to the drain electrode.

In an embodiment of the present disclosure, the method further includes forming a field plate on a side of the dielectric away from the semiconductor layer.

In an embodiment of the present disclosure, the forming at least two dielectrics located between the gate electrode and the drain electrode on the semiconductor layer includes: depositing a first dielectric on the semiconductor layer and the gate electrode; etching the first dielectric to retain a first dielectric adjacent to a side of the gate electrode; depositing a second dielectric having a dielectric coefficient less than that of the first dielectric on the semiconductor layer and the first dielectric; and polishing the second dielectric so that a surface of the second dielectric is flush with that of the first dielectric, wherein an end of the field plate adjacent to the drain electrode is disposed on the second dielectric.

In an embodiment of the present disclosure, the at least two dielectrics include a first dielectric and a second dielectric, and a dielectric coefficient of the second dielectric is less than that of the first dielectric, wherein the forming at least two dielectrics located between the gate electrode and the drain electrode on the semiconductor layer includes: depositing the second dielectric on the semiconductor layer and the gate electrode; etching the second dielectric so that the second dielectric is located between the gate electrode and the drain electrode and is adjacent to a side of the drain electrode; depositing the first dielectric on the semiconductor layer and the second dielectric; and polishing the first dielectric so that a surface of the first dielectric is flush with that of the second dielectric, wherein an end of the field plate adjacent to the drain electrode is disposed on the second dielectric.

In an embodiment of the present disclosure, the method further includes forming a third dielectric located between the second dielectric and the drain electrode on a side of the semiconductor layer.

According to technical solutions provided by embodiments of the present disclosure, by using at least two dielectrics having different dielectric coefficients, an equivalent stepped field plate or an equivalent inclined field plate is formed when a bias voltage is applied to the drain electrode of the semiconductor device, and an electric field peak at an end of the field plate is suppressed while an electric field peak at an end of the gate electrode adjacent to the drain electrode is pulled down, so that the entire electric field distribution is more uniform, no significant high electric field peak is generated, and an easy breakdown region is eliminated, thereby improving overall breakdown voltage and reliability of the semiconductor device.

BRIEF DESCRIPTION OF THE DRAWINGS

In order to describe the technical solutions of the embodiments of the present disclosure more clearly, accompanying drawings to be used in the embodiments will be briefly introduced below. It should be understood that the drawings below merely show some embodiments of the present disclosure and thus cannot be considered as limitations to the scope. A person of ordinary skills in the art may also obtain other relevant drawings according to these drawings without paying any creative effort.

FIG. 11-*a*, FIG. 11-*b*, FIG. 11-*c*, FIG. 11-*d*, FIG. 11-*e* and FIG. 11-*f* are structure change diagrams of a semiconductor device of a method of manufacturing a semiconductor device shown in FIG. 10.

Figure 1:
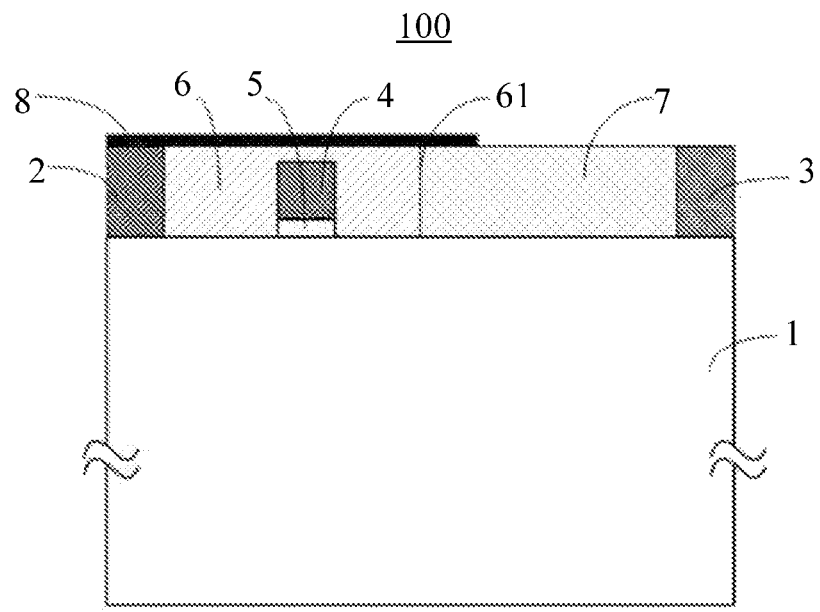
FIG. 1 is a structure diagram of a semiconductor device according to a first embodiment of the present disclosure.

Reference signs in the figures mentioned above:
100—semiconductor device; 1—semiconductor layer; 2—source electrode; 3—drain electrode; 4—gate electrode; 5—dielectric layer; 6—first dielectric; 7—second dielectric; 8—field plate; 61—contact surface; 9—third dielectric; 101—substrate; 102—buffer layer; 103—channel layer; 104—barrier layer; 105—nucleation layer; 200—photoresist.

DETAILED DESCRIPTION

Technical solutions in the embodiments of the present disclosure will be described clearly and completely with reference to the accompanying drawings in the present disclosure. Apparently, the embodiments described herein are merely some but not all the embodiments of the present disclosure. In general, the components in the embodiments of the present disclosure described and shown in the drawings herein may be arranged and designed in different configurations.

The detailed description of the embodiments of the present disclosure as provided in the drawings below is not intended to limit the protection scope of the present disclosure, but merely to denote the selected embodiments of the present disclosure. Based on the embodiments of the present disclosure, all other embodiments obtained by those skilled in the art without paying creative effort belong to the protection scope of the present disclosure.

It should be noted that like reference characters and letters denote like items in the following drawings. Thus, once a certain item is defined in one drawing, there is no need to define and explain it again in the subsequent drawings. Meanwhile, in the description of the present disclosure, terms "first", "second", etc. are merely used for differentiating, and cannot be interpreted to indicate or imply any relative importance.

In order not to add a new electric field peak while an electric field at an end of a gate electrode which is adjacent to a drain electrode is suppressed, a gradient distribution field plate structure in which a plurality of layers (for example, three layers) are stacked, or a signal-layer inclined field plate structure is utilized. For the gradient distribution field plate structure, since it should be made by multi-step lithography, dielectric deposition, metal deposition and other processes, and thus manufacturing cost of the device is increased. For the signal-layer inclined field plate structure, since it needs to increase inclined plane manufacturing process, and thus process difficulty is increased; further, a surface of the device is uneven due to the inclined plane, which results in process integration difficulties.

First Embodiment

FIG. 1 shows a structure diagram of a semiconductor device 100 according to an embodiment of the present disclosure. As shown in FIG. 1, the semiconductor device 100 includes a semiconductor layer 1, a source electrode 2, a drain electrode 3, a gate electrode 4, a first dielectric 6, a second dielectric 7 and a field plate 8.

The semiconductor layer 1 may be a single-layer structure, a double-layer structure or a multilayer structure composed of one or more semiconductor materials, and the present disclosure is not limited thereto. The semiconductor layer 1 may be made of semiconductor silicon (Si) material. Alternatively, the semiconductor layer 1 includes a semiconductor substrate and an epitaxial layer grown on the semiconductor substrate. Alternatively, the semiconductor layer 1 may be any structure made of semiconductor material in any semiconductor power device that needs to use the field plate 8. For example, the semiconductor layer 1 may be semiconductor material suitable for a high voltage laterally diffused metal oxide semiconductor (LDMOS) power device, a gallium nitride high electron mobility radio frequency device, a power electronic device, a SiC power device and a GaAs device.

The source electrode 2, the drain electrode 3 and the gate electrode 4 are respectively located on the semiconductor layer 1, wherein the source electrode 2 and the drain electrode 3 are located on opposite sides of the semiconductor layer 1, and the gate electrode 4 is located between the source electrode 2 and the drain electrode 3. Preferably, in the present embodiment, a dielectric layer 5 is formed between the gate electrode 4 and the semiconductor layer 1. The dielectric layer 5 is inserted under the gate electrode 4 to form a metal insulation semiconductor field effect transistor (MISFET) structure. The dielectric layer 5 serves as both a passivation layer of the device and an insulation layer of the gate electrode 4, thereby reducing leakage current of the gate electrode 4 effectively and adjusting a turn-on voltage. The dielectric layer 5 may be made of at least one of silicon nitride (SiN), silicon dioxide ($SiO_2$), silicon oxynitride (SiON), aluminum oxide ($Al_2O_3$), hafnium oxide ($HfO_2$) and hafnium aluminum oxide ($HfAlO_x$).

The first dielectric 6 is located between the gate electrode 4 and the drain electrode 3, and may or may not extend to the source electrode 2 (FIG. 1 shows an embodiment that the first dielectric 6 extends to the source electrode 2). That is, the first dielectric 6 may be or may not be formed between the source electrode 2 and the gate electrode 4, and other dielectrics may also be formed between the source electrode 2 and the gate electrode 4. The second dielectric 7 is located between the first dielectric 6 and the drain electrode 3, and is connected to the first dielectric 6. The second dielectric 7 may extend to the drain electrode 3 and be connected to the drain electrode 3, or may not extend to the drain electrode 3. A dielectric coefficient of the first dielectric 6 is different from that of the second dielectric 7, and sequentially decreases in a direction from the gate electrode 4 to the drain electrode 3. Preferably, in the present embodiment, the dielectric coefficient of the first dielectric 6 is greater than that of the second dielectric 7. Preferably, in the present embodiment, a contact surface 61 between the first dielectric 6 and the second dielectric 7 is a plane and is perpendicular to a surface of the semiconductor layer 1. When the contact surface 61 between the first dielectric 6 and the second dielectric 7 is perpendicular to the surface of the semiconductor layer 1, an angle between the contact surface 61 and the surface of the semiconductor layer 1 is equal to 90°. The first dielectric 6 and the second dielectric 7 have the same thickness, and the thickness thereof is greater than or equal to a thickness of the gate electrode 4. It should be noted that the thicknesses of the first dielectric 6 and the second dielectric 7 may also be adjusted according to specific processes and device designs.

The field plate 8 may be made of conductive materials, such as a metal element, an alloy or a composite metal, and the like, specific materials are determined according to processes and device requirements, and the present disclosure is not limited thereto. A structure of the field plate 8 may be a uniform field plate, a stepped field plate, a multi-layer field plate and a double-layer field plate. A surface of a side of the field plate 8 adjacent to the semiconductor layer 1 is in contact with upper surfaces of the source electrode 2, the first dielectric 6 and the second dielectric 7. A connection manner of the field plates 8 may include various types, for example, the field plates 8 is connected to the source electrode 2, the field plates 8 is connected to the gate electrode 4, the field plates 8 is individually connected to an independent potential, or the field plates 8 is used as a floating field plate without being connected to any potential. Preferably, in the present embodiment, the field plate 8 is connected to the source electrode 2 and extends from the source electrode 2 to the drain electrode 3, and at least extends onto the second dielectric 7.

An extension length of the field plate 8 located above the second dielectric 7 is set according to the thickness of the second dielectric 7 and a distance between the second dielectric 7 and the gate electrode 4, so that an entire electric field distribution is more uniform. Preferably, the extension length of the field plate 8 located above the second dielectric 7 is between 0.1 μm and 3 μm. Further, an end of the field plate 8 adjacent to the drain electrode 3 is located above the second dielectric 7 adjacent to the drain electrode 3. Further, an end of the field plate 8 between the gate electrode 4 and the drain electrode 3 is located above the second dielectric 7 having a small dielectric constant.

According to technical solutions provided by embodiments of the present disclosure, by using at least two dielectrics having different dielectric coefficients, an equivalent stepped field plate or an equivalent inclined field plate is formed when a bias voltage is applied to the drain electrode of the semiconductor device, and an electric field peak at an end of the field plate is suppressed while an electric field peak at an end of the gate electrode adjacent to the drain electrode is pulled down, so that the entire electric field distribution is more uniform, no significant high electric field peak is generated, and an easy breakdown region is eliminated, thereby improving overall breakdown voltage and reliability of the semiconductor device.

Second Embodiment

Figure 2:
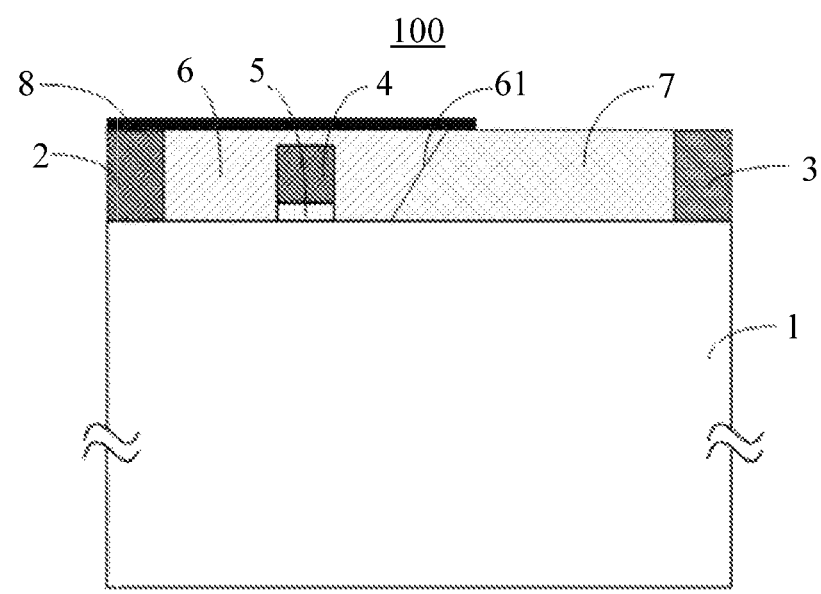
FIG. 2 is a structure diagram of a semiconductor device according to a second embodiment of the present disclosure.

FIG. 2 is a structure diagram of a semiconductor device 100 according to a second embodiment of the present disclosure. As shown in FIG. 2, the present embodiment differs from the first embodiment in that the contact surface 61 between the first dielectric 6 and the second dielectric 7 is a plane and is oblique to the surface of the semiconductor layer 1. An angle between the plane and the surface of the semiconductor layer 1 is greater than 0° and less than 180°, and an optimum included angle is greater than 30° and less than 70° or greater than 120° and less than 160°.

According to technical solutions provided by embodiments of the present disclosure, by changing the angle between the plane and the surface of the semiconductor layer, the electric field distribution is adjusted, so that the electric field in the semiconductor device may be excessively smoothed over a larger range, thereby reducing the electric field peak, and realizing higher breakdown voltage, better dynamic performance and excellent long-term reliability.

Third Embodiment

Figure 3:
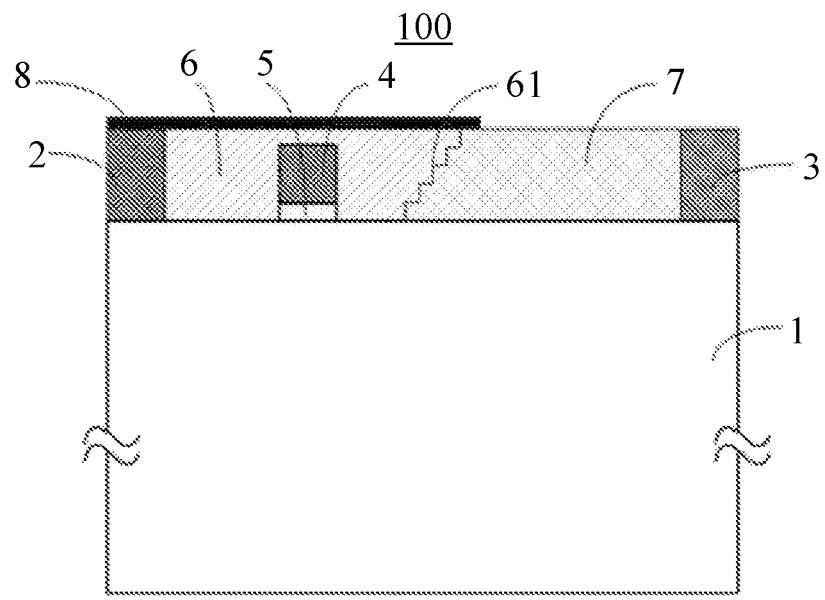
FIG. 3 is a structure diagram of a semiconductor device according to a third embodiment of the present disclosure.

FIG. 3 is a structure diagram of a semiconductor device 100 according to a third embodiment of the present disclosure. As shown in FIG. 3, the present embodiment differs from the first embodiment in that the first dielectric 6 has a first step portion at the contact surface 61 with the second dielectric 7, and the second dielectric 7 has a second step portion matching with the first step portion at the contact surface 61 with the first dielectric 6. The contact surface 61 between the first dielectric 6 and the second dielectric 7 is trapezoid-shaped rather than planar.

According to technical solutions provided by embodiments of the present disclosure, by changing the step height and the number of the first dielectric and the second dielectric, the electric field distribution is adjusted, so that the electric field in the semiconductor device may be excessively smoothed over a larger range, thereby reducing the electric field peak, and realizing higher breakdown voltage, better dynamic performance and excellent long-term reliability.

It should be understood that the contact surface 61 between the first dielectric 6 and the second dielectric 7 may also be a curved surface. The curved surface may be composed of a cambered surface, or may be composed of a plurality of cambered surfaces, or may be a mixture of a plane and a cambered surface.

Fourth Embodiment

Figure 4:
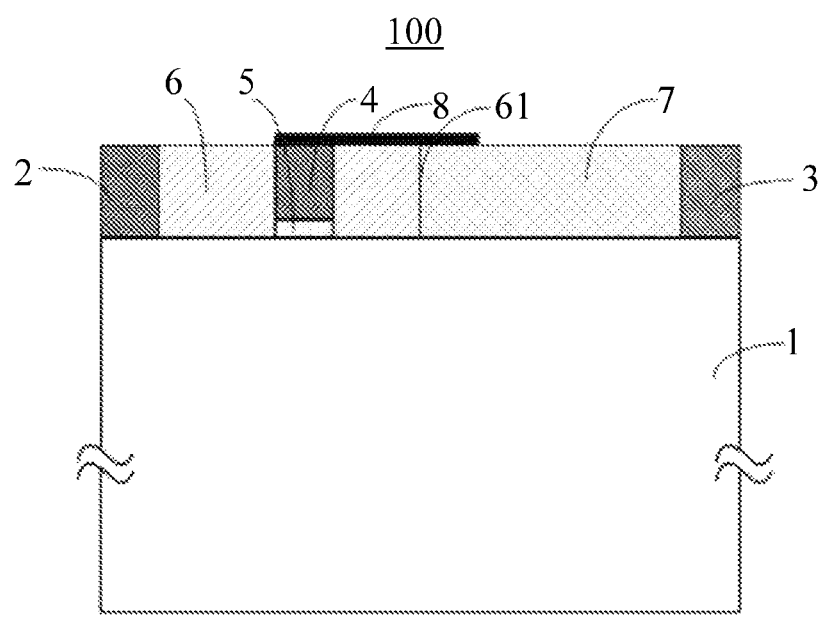
FIG. 4 is a structure diagram of a semiconductor device according to a fourth embodiment of the present disclosure.

FIG. 4 is a structure diagram of a semiconductor device 100 according to a fourth embodiment of the present disclosure. As shown in FIG. 4, the present embodiment differs from the first embodiment in that the field plate 8 is connected to the gate electrode 4 and extends from the gate electrode 4 to the drain electrode 3, and at least extends onto the second dielectric 7.

According to technical solutions provided by embodiments of the present disclosure, by connecting the field plate and the gate, a gate electrode inclined field plate device structure is formed, and thus electric field intensity distribution at an edge of the gate electrode can be effectively adjusted, thereby improving characteristics of the device.

It should be understood that the structure of the semiconductor device 100 provided by the fourth embodiment can also be modified in accordance with the second embodiment and the third embodiment. For example, the contact surface 61 between the first dielectric 6 and the second dielectric 7 may be oblique to the surface of the semiconductor layer 1, or the first dielectric 6 may have a first step portion at the contact surface 61 with the second dielectric 7, and the second dielectric 7 may have a second step portion matching with the first step portion at the contact surface 61 with the first dielectric 6, and the contact surface 61 between the first dielectric 6 and the second dielectric 7 is trapezoid-shaped.

Compared with the stepped field plate, the multi-layer field plate or the inclined field plate, the first embodiment, the second embodiment, the third embodiment and the fourth embodiment of the present disclosure use two dielectrics having different dielectric coefficients, so that an equivalent stepped field plate or an equivalent inclined field plate is formed when a bias voltage is applied to the drain electrode of the semiconductor device, and an electric field peak at an end of the field plate is suppressed while an electric field peak at an end of the gate electrode adjacent to the drain electrode is pulled down, so that the entire electric field distribution is more uniform, no significant high electric field peak is generated, and an easy breakdown region is eliminated, thereby improving overall breakdown voltage and reliability of the semiconductor device. Further, the dielectric constant of the second dielectric adjacent to the drain electrode is less than that of the first dielectric adjacent to the gate electrode, so that parasitic capacitance effect is gradually weakened, thereby improving the influence of the field plate on the high frequency characteristics of the semiconductor device. Therefore, the present disclosure may achieve the same or better effects as the stepped field plate, the multi-layer field plate or the inclined field plate by using a single-layer flat-plate field plate structure. In addition, by using the single-layer flat-plate field plate structure, the embodiments of the present disclosure may have the advantages of simple manufacture, easy manufacture and low manufacturing cost.

Fifth Embodiment

Figure 5:
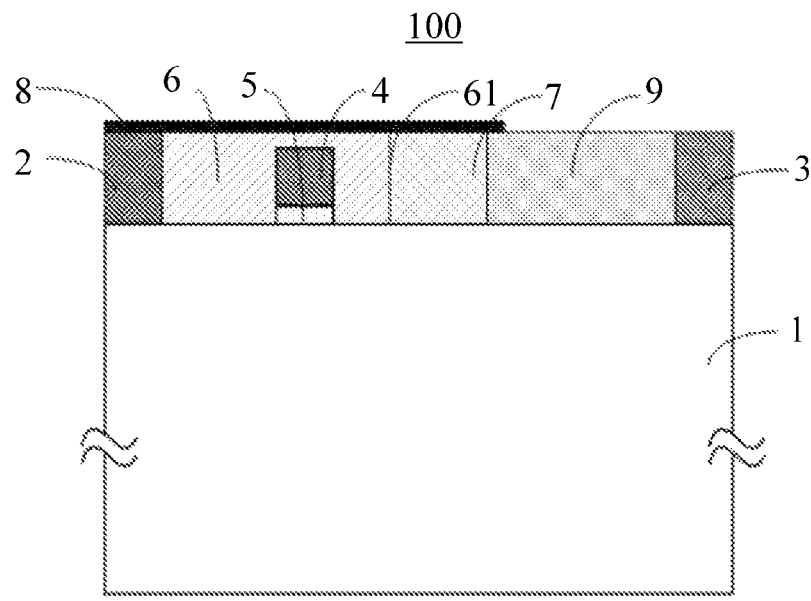
FIG. 5 is a structure diagram of a semiconductor device according to a fifth embodiment of the present disclosure.

FIG. 5 is a structure diagram of a semiconductor device 100 according to a fifth embodiment of the present disclosure. As shown in FIG. 5, the present embodiment differs from the first embodiment in that the semiconductor device 100 further includes a third dielectric 9 located between the second dielectric 7 and the drain electrode 3. Preferably, in the present embodiment, a dielectric coefficient of the third dielectric 9 is less than that of the second dielectric 7, that is, the dielectric coefficient of the dielectric layer located between the gate electrode and the drain electrode decreases gradually from the gate electrode to the drain electrode.

According to technical solutions provided by embodiments of the present disclosure, by adding the third dielectric under the field plate, the electric field peak at the end of the field plate is better optimized while optimizing the electric field at the end of the gate electrode near the drain electrode, thereby increasing the method of optimizing the electric field distribution, and better improving characteristics of the device.

It should be understood that shapes of contact surfaces 61 among the first dielectric 6, the second dielectric 7 and the third dielectric 9 and the positional relationship with the surface of the semiconductor layer 1 are not limited to those shown in FIG. 5. For example, the contact surfaces 61 among the first dielectric 6, the second dielectric 7 and the third dielectric 9 may be a plane perpendicular to the surface of the semiconductor layer 1, or may be a plane oblique to the surface of the semiconductor layer 1, or may be trapezoid-shaped, or other structures commonly known to those skilled in the art, and the present disclosure is not limited thereto.

It should also be understood that the semiconductor device 100 provided by the present disclosure is not limited to including only two or three dielectrics having different dielectric coefficients, and may also include a plurality of adjacent dielectrics having different dielectric coefficients. Preferably, in the plurality of dielectrics having different dielectric coefficients, a dielectric coefficient of a dielectric adjacent to the gate electrode 4 is greater than a dielectric coefficient of a dielectric away from the gate electrode 4 and adjacent to the drain electrode 3. Contact surfaces 61 among the plurality of dielectrics having different dielectric coefficients may be a plane which is perpendicular or oblique to the surface of the semiconductor layer 1, or the contact surface 61 between each dielectric and another dielectric has a trapezoidal portion, or the contact surface 61 between each dielectric and another dielectric is a curved surface, and there is no limitation here.

Sixth Embodiment

Figure 6:
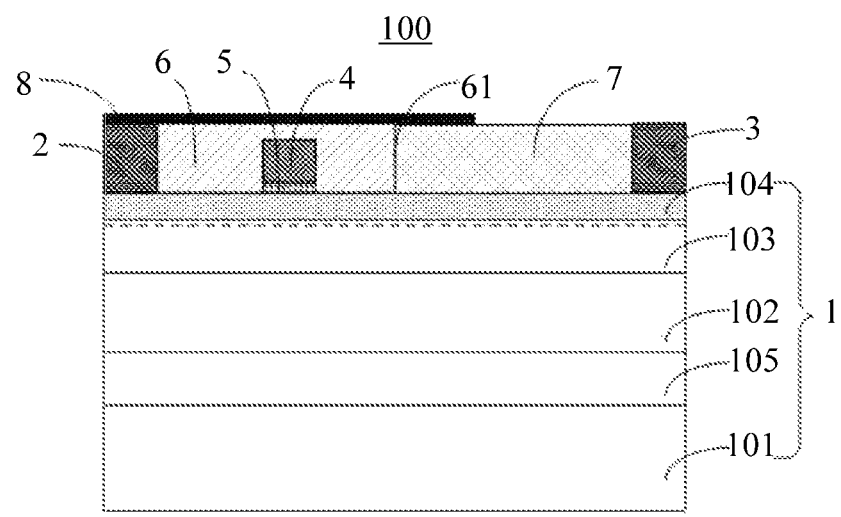
FIG. 6 and FIG. 7 are structure diagrams of a semiconductor device according to a sixth embodiment of the present disclosure.

FIG. 6 is a structure diagram of a semiconductor device 100 according to a sixth embodiment of the present disclosure. As shown in FIG. 6, the present embodiment differs from the first embodiment in that the semiconductor layer 1 includes a substrate 101, a buffer layer 102 formed on a side of the substrate 101, a channel layer 103 formed on a side of the buffer layer 102 away from the substrate 101, and a barrier layer 104 formed on a side of the channel layer 103 away from the buffer layer 102.

The substrate 101 may be made of sapphire, silicon carbide (SiC), gallium nitride (GaN), silicon (Si), rare earth oxide (REO), or any other materials, which are suitable for growing III-V compounds, commonly known to those skilled in the art, and the present disclosure is not limited thereto.

The buffer layer 102 includes gallium nitride (GaN), aluminum nitride (AlN), or other nitrides which are configured to match the material of the substrate 101 and a high quality epitaxial gallium nitride (GaN) layer, and affect parameters of a heterojunction composed of gallium nitride or aluminum gallium nitride (AlGaN), such as crystalline quality, surface topography, electrical property, and the like.

If the material of the substrate 101 has a large lattice mismatch with that of the buffer layer 102, preferably, in the present embodiment, the semiconductor layer 1 further includes a nucleation layer 105. The nucleation layer 105 is located between the substrate 101 and the buffer layer 102, so as to reduce lattice mismatch between the substrate 101 and the buffer layer 102. Preferably, in the present embodiment, the nucleation layer 105 is made of aluminum nitride (AlN).

Lattice quality of the channel layer 103 is better than that of the buffer layer 102, and carrier mobility of the channel layer 103 is higher than that of the buffer layer 102. The channel layer 103 may be made of gallium nitride (GaN), indium aluminum gallium nitride (InAlGaN), aluminum gallium nitride (AlGaN), indium aluminum nitride (InAlN), aluminum nitride (AlN), and at least one of other semiconductor materials commonly known to those skilled in the art. Preferably, in the present embodiment, the material of the channel layer 103 is gallium nitride (GaN).

The barrier layer 104 is a laminated layer stacked by multilayer semiconductor material which can form a heterojunction with the channel layer 103 or multilayer semiconductor material and insulation material which can form a heterojunction with the channel layer 103. The semiconductor material may be, but not limited to, indium aluminum gallium nitride (InAlGaN), aluminum gallium nitride (AlGaN), indium aluminum nitride (InAlN) and aluminum nitride (AlN). The channel layer 103 and the barrier layer 104 constitute a semiconductor heterojunction structure together, a high concentration two-dimensional electron gas is formed at an interface between the channel layer 103 and the barrier layer 104, and a conductive channel is generated at an interface of the heterojunction of the channel layer 103.

Figure 7:
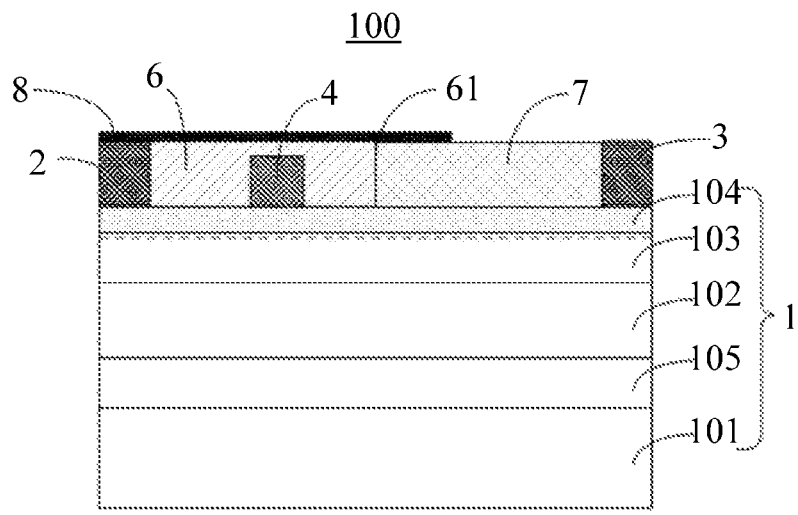

In another embodiment of the sixth embodiment of the present disclosure, as shown in FIG. 7, the dielectric layer 5 located between the gate electrode 4 and the semiconductor layer 1 may also be omitted.

Preferably, in other embodiments, the semiconductor layer 1 may further include a cap layer located on a side of the barrier layer 104 away from the channel layer 103. The cap layer may prevent the surface of the barrier layer 104 from being oxidized, and may also suppress current collapse. The material of the cap layer may be materials commonly known to those skilled in the art, such as aluminum gallium nitride (AlGaN) and gallium nitride (GaN).

Figure 8:
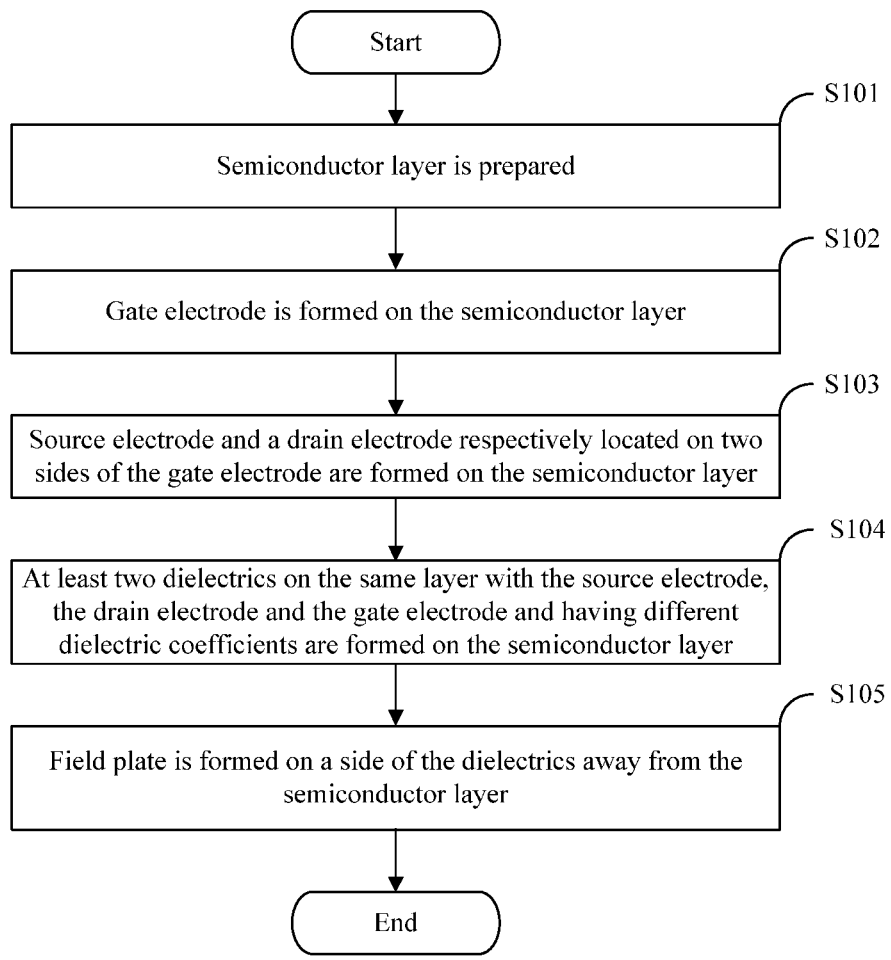
FIG. 8 is a flowchart of a method of manufacturing a semiconductor device according to an embodiment of the present disclosure.

FIG. 8 is a flowchart of a method of manufacturing a semiconductor device 100 according to an embodiment of the present disclosure. As shown in FIG. 8, the method of manufacturing a semiconductor device 100 includes following steps S101, S102, S103, S104 and S105.

S101, a semiconductor layer is prepared.

S102, a gate electrode is formed on the semiconductor layer.

S103, a source electrode and a drain electrode respectively located on two sides of the gate electrode are formed on the semiconductor layer.

S104, at least two dielectrics located between the gate electrode and the drain electrode are formed on the semiconductor layer, wherein the at least two dielectrics have different dielectric coefficients. Preferably, a dielectric coefficient of a dielectric adjacent to the gate electrode is greater than that of a dielectric away from the gate electrode.

S105, a field plate is formed on a side of the at least two dielectrics away from the semiconductor layer. Preferably, the field plate is a metal field plate. The metal field plate may be formed by a metal electron beam evaporation process, a metal sputtering process, or a metal chemical vapor deposition process, and the like, and the specific manufacturing process may be determined according to process conditions or design.

Figure 9:
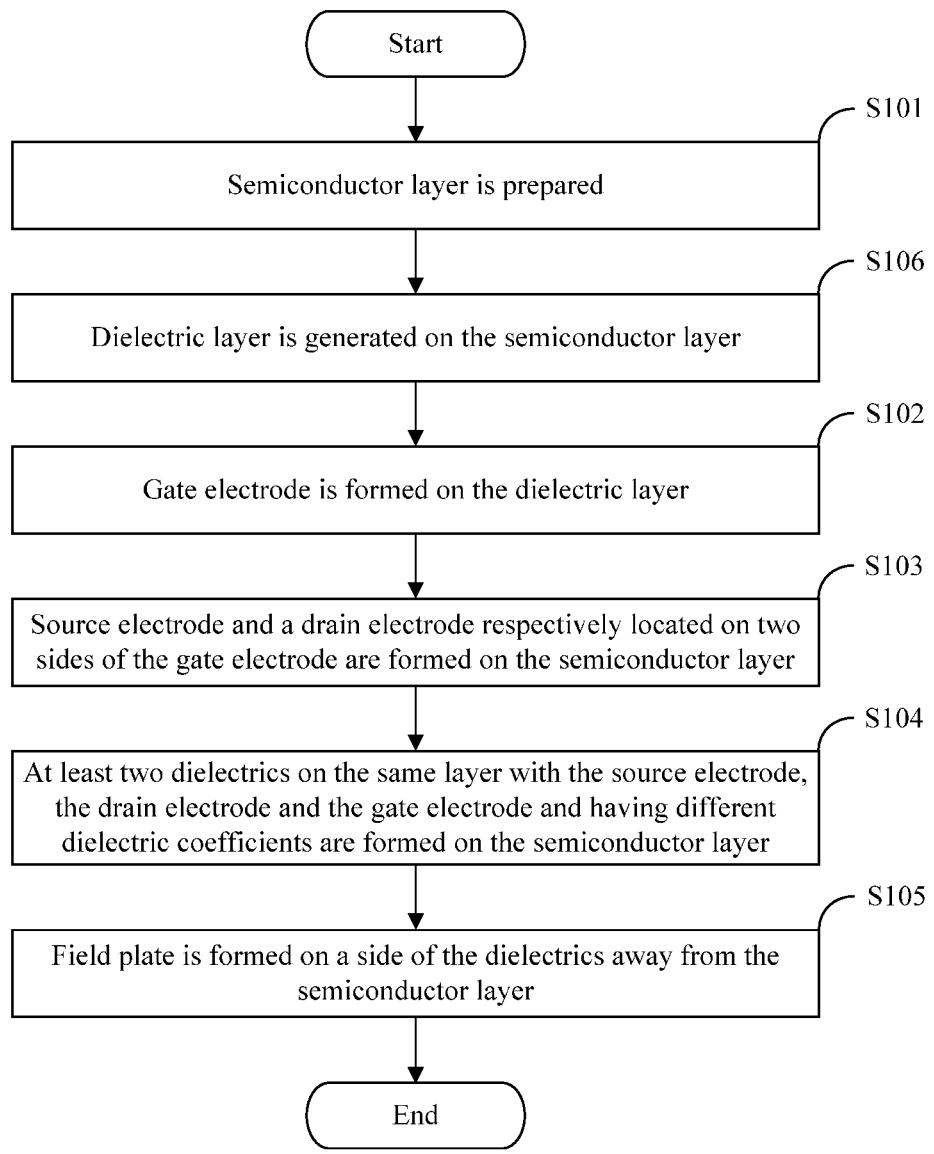
FIG. 9 is a flowchart of a method of manufacturing a semiconductor device according to another embodiment of the present disclosure.

FIG. 9 is a flowchart of a method of manufacturing a semiconductor device according to another embodiment of the present disclosure. As shown in FIG. 9, after S101 and before S102, the method may further include S106, a dielectric layer is generated on the semiconductor layer. Then, S102 is that the gate electrode is formed on the dielectric layer.

In the method of manufacturing a semiconductor device, an implementation order of the above steps is not limited, and may be flexibly designed according to the situation. For example, the implementation order of S103 and S104 may be interchanged. When the method of manufacturing a semiconductor device is applied for manufacturing a semiconductor device including two dielectrics, S104 further includes S1041, S1042, S1043, S1044 and S1045.

Figure 10:
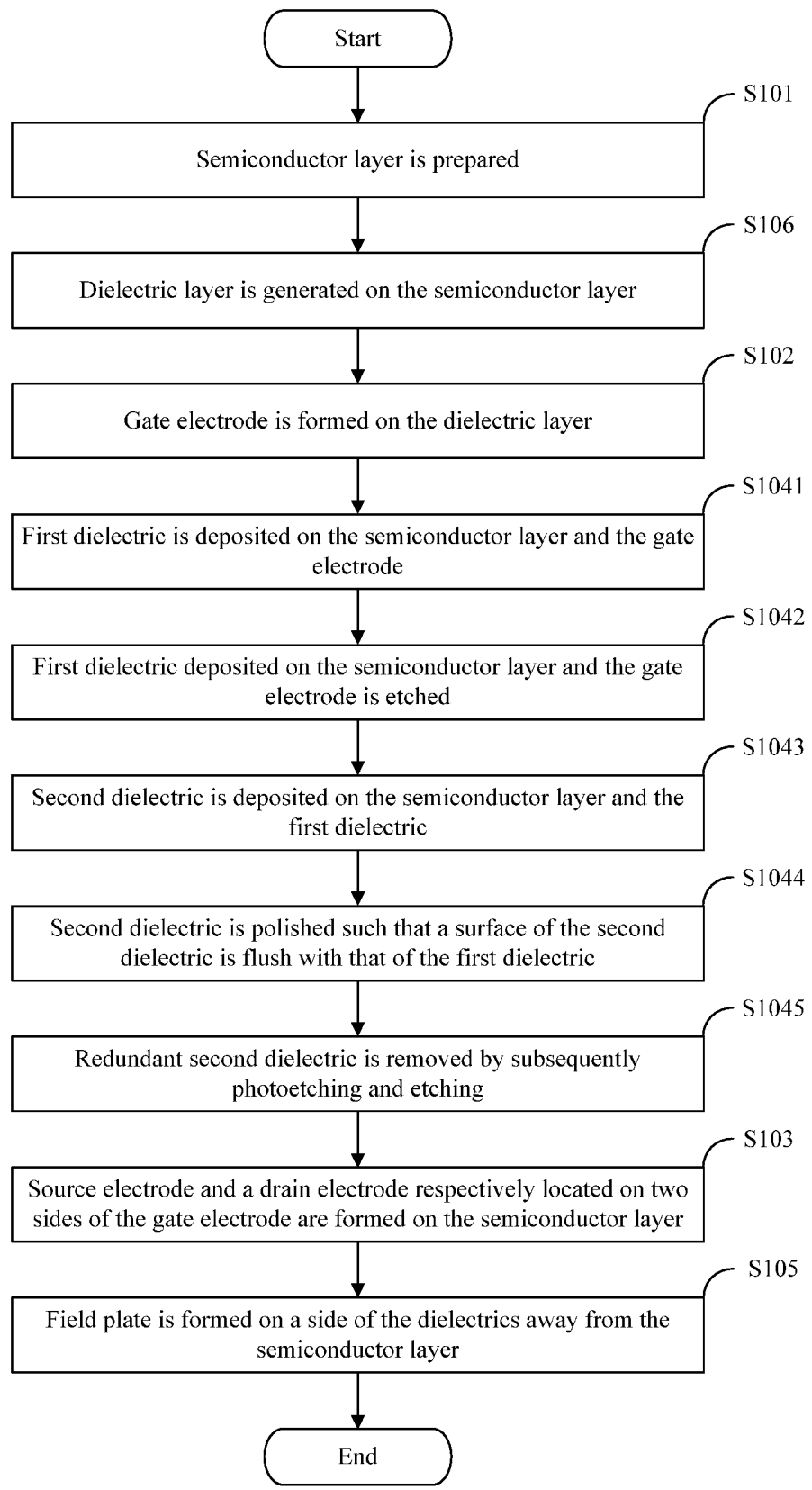
FIG. 10 is a flowchart of a method of manufacturing a semiconductor device according to another embodiment of the present disclosure.

FIG. 10 is a flowchart of a method of manufacturing a semiconductor device according to another embodiment of the present disclosure. FIG. 11-a, FIG. 11-b, FIG. 11-c, FIG. 11-d, FIG. 11-e and FIG. 11-f are structure change diagrams of a semiconductor device of a method of manufacturing a semiconductor device shown in FIG. 10.

As shown in FIG. 10, the method of manufacturing a semiconductor device may include:

S101, a semiconductor layer is prepared.

S106, a dielectric layer is generated on the semiconductor layer.

S102, a gate electrode is formed on a side of the semiconductor layer.

S1041, a first dielectric is deposited on the semiconductor layer and the gate electrode.

S1042, the first dielectric is etched.

Specifically, as shown in FIG. 11-a, a photoresist 200 is deposited on the first dielectric 6 and exposed and developed. Further, as shown in FIG. 11-b, the first dielectric 6 in a exposed region is removed by etching.

S1043, a second dielectric is deposited on the semiconductor layer and the first dielectric.

Specifically, as shown in FIG. 11-c, the second dielectric 7 is formed on the semiconductor layer 1 and the first dielectric 6 by depositing. Preferably, a dielectric constant of the second dielectric 7 is less than that of the first dielectric 6.

S1044, the second dielectric is polished so that a surface of the second dielectric is flush with that of the first dielectric.

Specifically, as shown in FIG. 11-d, the second dielectric 7 is polished to planarize the surface of the second dielectric 7, that is, the surface of the second dielectric 7 is flush with that of the first dielectric 6.

S1045, redundant second dielectric is removed by subsequent photoetching and etching.

Specifically, as shown in FIG. 11-e, the redundant second dielectric 7 is removed by a subsequent photolithography process and etching process, and positions of a source electrode 2 and a drain electrode 3 are reserved on the semiconductor layer 1.

S103, a source electrode and a drain electrode respectively located on two sides of the gate electrode are formed on the semiconductor layer.

Specifically, as shown in FIG. 11-f, the source electrode 2 and the drain electrode 3 are respectively formed at reserved positions on the semiconductor layer 1, and the source electrode 2 and the drain electrode 3 are respectively located on both sides of the gate electrode 4.

S105, a field plate is formed on a side of the first dielectric and the second dielectric away from the semiconductor layer.

Specifically, as shown in FIG. 1, a field plate 8 is formed on the first dielectric 6 and the second dielectric 7, wherein an end of the field plate 8 adjacent to the drain electrode 3 is located on the second dielectric 7.

Optionally, in another embodiment, the second dielectric 7 may be formed firstly, and then the first dielectric 6 is formed. The specific steps are as follows:

depositing a second dielectric on the semiconductor layer and the gate electrode;

etching the second dielectric so that the second dielectric is located between the gate electrode and the drain electrode;

depositing a first dielectric on the semiconductor layer and the second dielectric; and polishing the first dielectric so that a surface of the first dielectric is flush with that of the second dielectric, wherein an end of the field plate adjacent to the drain electrode is disposed on the second dielectric.

When the method of manufacturing a semiconductor device 100 is applied for manufacturing the semiconductor device 100 including three dielectrics, the method further includes forming a third dielectric located between the second dielectric and the drain electrode on a side of the semiconductor layer.

In the semiconductor device provided by the present disclosure, by using at least two dielectrics having different dielectric coefficients, an equivalent stepped field plate or an equivalent inclined field plate is formed when a bias voltage is applied to the drain electrode of the semiconductor device, and an electric field peak at an end of the field plate is suppressed while an electric field peak at an end of the gate electrode adjacent to the drain electrode is pulled down, so that the entire electric field distribution is more uniform, no significant high electric field peak is generated, and an easy breakdown region is eliminated, thereby improving overall breakdown voltage and reliability of the semiconductor device. Further, the dielectric constant of the dielectric adjacent to the gate electrode is greater than that of the dielectric away from the gate electrode, so that parasitic capacitance effect is gradually weakened, thereby improving the influence of the field plate on the high frequency characteristics of the semiconductor device. Therefore, the present disclosure may achieve the same or better effects as the stepped field plate, the multi-layer field plate or the inclined field plate by using a single-layer flat-plate field plate structure. In addition, by using the single-layer flat-plate field plate structure, the embodiments of the present disclosure may have the advantages of simple manufacture, easy manufacture and low manufacturing cost.

In the descriptions of the present disclosure, it should be noted that unless otherwise clearly specified and defined, the terms such as "dispose", "interconnect" and "connect" should be understood in the broad sense. For example, there may be a fixed connection, a detachable connection, or an integral connection; there may be a mechanical connection, or an electrical connection; there may be a direct interconnection, an indirect interconnection via an intermediate medium, or an internal connection between two components. A person of ordinary skills in the art may understand specific meanings of the foregoing terms in the present disclosure according to specific circumstances.

In the descriptions of the present disclosure, it should be noted that azimuth or positional relationships indicated by the terms such as "up", "down", "inside" and "outside" and the like are azimuth or positional relationships shown in the drawings, or usual azimuth or positional relationships when using the products of the present disclosure, which are only to facilitate description of the embodiments of the present disclosure and simplify the description, but not to indicate or imply that the device or component must have a specific azimuth, or be constructed or operated in the specific azimuth, which thus cannot be understood as a limitation to the present disclosure.

The above description is only preferred embodiments of the present disclosure and should not be intended to limit the present disclosure. Those skilled in the art can make various modifications and variations to the present disclosure. Any modification, equivalent substitution, improvement etc. made within the spirit and principle of the present disclosure should be encompassed in the protection scope of the present disclosure.

INDUSTRIAL APPLICABILITY

In the semiconductor device and the method of manufacturing the same of the present disclosure, by using at least two dielectrics having different dielectric coefficients, an equivalent stepped field plate or an equivalent inclined field plate is formed when a bias voltage is applied to the drain electrode of the semiconductor device, and an electric field peak at an end of the field plate is suppressed while an electric field peak at an end of the gate electrode adjacent to the drain electrode is pulled down, so that the entire electric field distribution is more uniform, no significant high electric field peak is generated, and an easy breakdown region is eliminated, thereby improving overall breakdown voltage and reliability of the semiconductor device.

What is claimed is:

1. A semiconductor device, comprising:
   a semiconductor layer;
   a source electrode, a drain electrode and a gate electrode located between the source electrode and the drain electrode disposed on a side of the semiconductor layer; and
   at least two dielectrics located between the gate electrode and the drain electrode, wherein the at least two dielectrics comprise a first dielectric, a second dielectric and a third dielectric, the first dielectric, the second dielectric and the third dielectric are disposed in the same layer and arranged sequentially along a direction from the source electrode to the drain electrode, the first dielectric is adjacent to the gate electrode relative to the second dielectric, the third dielectric is adjacent to the drain electrode, the third dielectric is in contact with the drain electrode, the second dielectric is located between the first dielectric and the third dielectric, a dielectric coefficient of a the first dielectric is greater than that of the second dielectric, and the dielectric coefficient of the second dielectric is greater than that of the third dielectric.

2. The semiconductor device according to claim 1, further comprising:
   a field plate disposed on a side of the at least two dielectrics away from the semiconductor layer, wherein an end of the field plate adjacent to the drain electrode is disposed above the second dielectric.

3. The semiconductor device according to claim 1, wherein the dielectric coefficients of the at least two dielectrics sequentially decrease in a direction from the gate electrode to the drain electrode.

4. The semiconductor device according to claim 2, wherein an the end of the field plate located between the gate electrode and the drain electrode is disposed above the second dielectric.

5. The semiconductor device according to claim 1, wherein a contact surface between adjacent dielectrics in the at least two dielectrics is any one of a plane, a curved surface and a trapezoid-shaped surface.

6. The semiconductor device according to claim 2, wherein the first dielectric is adjacent to the gate electrode, the second dielectric is located between the first dielectric and the drain electrode, the end of the field plate adjacent to the drain electrode is disposed on the second dielectric, and the first dielectric is connected to the second dielectric.

7. The semiconductor device according to claim 6, wherein a contact surface between the first dielectric and the second dielectric is a plane, and an angle between the plane and a surface of the semiconductor layer is greater than 0° and less than 180°.

8. The semiconductor device according to claim 6, wherein a contact surface between the first dielectric and the second dielectric is a curved surface.

9. The semiconductor device according to claim 6, wherein the first dielectric has a first step portion at a contact surface with the second dielectric, and the second dielectric has a second step portion matching with the first step portion at a contact surface with the first dielectric.

10. The semiconductor device according to claim 6, wherein the field plate is connected to the source electrode and extends upward over the gate electrode to the drain electrode, and at least extends onto the second dielectric.

11. The semiconductor device according to claim 6, wherein the field plate is connected to the gate electrode and extends from the gate electrode to the drain electrode, and at least extends onto the second dielectric.

12. The semiconductor device according to claim 1, wherein the semiconductor layer comprises a semiconductor substrate and an epitaxial layer grown on the semi conductor substrate.

13. The semiconductor device according to claim 1, wherein the semiconductor layer comprises a substrate, a buffer layer disposed on a side of the substrate, a channel layer disposed on a side of the buffer layer away from the substrate, and a barrier layer disposed on a side of the channel layer away from the buffer layer.

14. A method of manufacturing a semiconductor device, comprising:
   preparing a semiconductor layer;
   forming a gate electrode on the semiconductor layer;
   forming a source electrode and a drain electrode respectively located on two sides of the gate electrode on the semiconductor layer; and
   forming at least two dielectrics located between the gate electrode and the drain electrode on the semiconductor layer, wherein the at least two dielectrics comprise a first dielectric, a second dielectric and a third dielectric, the first dielectric, the second dielectric and the third dielectric are disposed in the same layer and arranged sequentially along a direction from the source electrode to the drain electrode, the first dielectric is adjacent to the gate electrode relative to the second dielectric, the third dielectric is adjacent to the drain electrode, the third dielectric is in contact with the drain electrode, the second dielectric is located between the first dielectric and the third dielectric, a dielectric coefficient of a the first dielectric is greater than that of the second dielectric, and the dielectric coefficient of the second dielectric is greater than that of the third dielectric.

15. The method according to claim 14, further comprising:
   forming a field plate on a side of the at least two dielectrics away from the semiconductor layer.

16. The method according to claim 15, wherein the forming at least two dielectrics located between the gate electrode and the drain electrode on the semiconductor layer comprises:
   depositing the first dielectric on the semiconductor layer and the gate electrode;
   etching the first dielectric to retain a the first dielectric adjacent to the gate electrode;
   depositing the second dielectric on the semiconductor layer and the first dielectric; and
   polishing the second dielectric so that a surface of the second dielectric is flush with that of the first dielectric;

forming the third dielectric located between the second dielectric and the drain electrode on a side of the semiconductor layer, wherein an end of the field plate adjacent to the drain electrode is disposed on the second dielectric.

17. The method according to claim 15, wherein the forming at least two dielectrics located between the gate electrode and the drain electrode on the semiconductor layer comprises:

depositing the second dielectric on the semiconductor layer and the gate electrode;

etching the second dielectric so that the second dielectric is located between the gate electrode and the drain electrode and is adjacent to the drain electrode;

depositing the first dielectric on the semiconductor layer and the second dielectric; and polishing the first dielectric so that a surface of the first dielectric is flush with that of the second dielectric;

forming the third dielectric located between the second dielectric and the drain electrode on a side of the semiconductor layer, wherein an end of the field plate adjacent to the drain electrode is disposed on the second dielectric.

* * * * *